(12) United States Patent
Nagano et al.

(10) Patent No.: US 6,326,671 B1
(45) Date of Patent: Dec. 4, 2001

(54) SEMICONDUCTOR MEMORY DEVICE AND METHOD FOR MANUFACTURING THE SAME

(75) Inventors: Yoshihisa Nagano, Osaka; Keisuke Tanaka, Shiga; Toru Nasu, Kyoto, all of (JP)

(73) Assignee: Matsushita Electronics Corporation, Osaka (JP)

( * ) Notice: Subject to any disclaimer, the term of this patent is extended or adjusted under 35 U.S.C. 154(b) by 0 days.

(21) Appl. No.: 09/452,620

(22) Filed: Dec. 1, 1999

(30) Foreign Application Priority Data

Dec. 3, 1998 (JP) .................................................. 10-343896

(51) Int. Cl.[7] .......................... H01L 31/07; H01L 31/108
(52) U.S. Cl. ......................... 257/486; 438/240; 438/785; 257/751; 257/9
(58) Field of Search .................... 438/976, 769, 438/781, 785, 240, 396, 241, 393; 257/295, 310, 306

(56) References Cited

U.S. PATENT DOCUMENTS

| | | |
|---|---|---|
| 4,938,839 | 7/1990 | Shuzo et al. |
| 5,624,864 * | 4/1997 | Arita et al. ............................ 437/3 |
| 5,943,568 * | 8/1999 | Fujii et al. ........................... 438/240 |

FOREIGN PATENT DOCUMENTS

| | | |
|---|---|---|
| 0766319 | 4/1997 | (EP) . |
| 0837504 | 4/1998 | (EP) . |
| 118360 | 12/1999 | (JP) . |

OTHER PUBLICATIONS

European Search Report related to European Patent Application No. 99123822 dated May 8, 2001.

* cited by examiner

Primary Examiner—Matthew Smith
Assistant Examiner—Calvin Lee
(74) Attorney, Agent, or Firm—Renner, Otto, Boisselle & Sklar

(57) ABSTRACT

A semiconductor memory device, includes: a semiconductor substrate including a transistor; a first protective insulating film for covering the semiconductor substrate; at least one data storage capacitor element formed on the first protective insulating film; a second protective insulating film for covering the first protective insulating film and the capacitor element; a hydrogen carrier layer; and an interconnection layer for electrically connecting the transistor and the capacitor element, wherein: the capacitor element includes a lower electrode formed on the first protective insulating film, a capacitor film formed on the lower electrode, and an upper electrode formed on the capacitor film, the capacitor film includes an insulating metal oxide, the second protective insulating film has a first contact hole reaching the upper electrode and a second contact hole reaching the lower electrode, and the hydrogen barrier layer is provided in the first and second contact holes, so as not to expose the upper and the lower electrodes.

5 Claims, 8 Drawing Sheets

SEMICONDUCTOR MEMORY DEVICE AND METHOD FOR MANUFACTURING THE SAME

BACKGROUND OF THE INVENTION

1. Field of the Invention

The present invention relates to a semiconductor memory device and a method for manufacturing the same, and more particularly, relates to a semiconductor memory device including a capacitor film formed of an insulating metal oxide and a method for manufacturing the same.

2. Description of the Related Art

Along with an improvement of digital technology, the tendency to process and store a large capacity of data has been promoted, resulting in an increased sophistication of electronic apparatuses, and with regard to a semiconductor device used in these apparatuses, a significant reduction of the semiconductor element size has been sought.

In accordance with this trend, techniques of using a highly dielectric material for a insulating capacitor film, instead of conventional silicon oxides or nitrides, are being widely researched and developed in order to realize a higher integration of a dynamic RAM.

In addition, Researches and developments are actively under way on ferroelectric film having spontaneous polarization characteristics, in order to obtain a practical non-volatile RAM capable of a low voltage operation and a high reading/writing rate.

The most crucial objective for realization of such semiconductor memory devices is to develop a process capable of integrating a capacitor element on a CMOS integrated circuit without characteristic degradation.

Hereinafter, referring to FIG. 6, a conventional semiconductor memory device 500 and a method for manufacturing the same will be described.

As shown in FIG. 6, the semiconductor memory device 500 includes a semiconductor substrate 33 on which a transistor 34, including source and drain regions 21 and a gate electrode 22, is formed. A first protective insulation film 23 is formed to cover the entire surface of the semiconductor substrate 33.

A data storage capacitor element 35 is formed on the first protective insulation film 23. The capacitor element 35 includes a lower electrode 24, a capacitor film 25 formed of an insulating metal oxide, and an upper electrode 26.

A hydrogen barrier layer 27 having the function of an interconnection layer is formed to cover the data storage capacitor element 35. A second protective insulating film 28 is formed to cover the entire surface of the first protective insulation film 23 and the hydrogen barrier layer 27.

By etching the second protective insulating film 28 and the hydrogen barrier layer 27, contact holes 29 partially exposing the upper electrode 26 and a contact hole 30 partially exposing the lower electrode 24 are formed. By etching the first protective insulation film 23 and the second protective insulating film 28, contact holes 31 partially exposing the transistor 34 are formed. Finally, an interconnection layer 32 connecting the transistor 34 and the capacitor element 35 is formed in a predetermined location.

In the conventional semiconductor memory device 500, the hydrogen barrier layer 27 is formed to cover the capacitor element 35. Because the hydrogen barrier layer 27 is formed of a material acting as a barrier against hydrogen in the process after the interconnection layer 32 is formed, the hydrogen barrier layer 27 is capable of suppressing the characteristic degradation of the capacitor element 35 caused by the reduction reaction of the capacitor film 25 formed of an insulating metal oxide.

The inventors of the present invention have found, however, the conventional process mentioned above has yet another unsolved problem in the process prior to the formation of the interconnection layer 32. Now, this problem will be described referring to FIGS. 7A through 7D.

As shown in FIG. 7A, a resist layer 61 is formed on the second protective insulating film 28 for forming the contact hole 29 through the second protective insulating film 28 and the hydrogen barrier layer 27 formed on the upper electrode 26 formed of platinum.

As shown in FIG. 7B, the resist layer 61 is then removed using an oxygen plasma. In this process, a part of the OH bases 62 generated during the removal of the resist layer 61 are decomposed by the catalytic reaction on a surface 26A of the upper electrode 26. As a result, as shown in FIG. 7C, active hydrogen 63 is generated.

As shown in FIG. 7C, the active hydrogen 63 disperses in the upper electrode 26. As a result, as shown in FIG. 7D, the hydrogen 63 disperses in the capacitor element 35. This means the active hydrogen 63 disperses in the capacitor film 25 through the contact hole 29 and through the contact hole 30. This reduces the capacitor film 25 formed of an insulating metal oxide, and then creates characteristic degradation on the capacitor element 35.

The catalytic reaction generating the active hydrogen 63 on the surface 26A of the upper electrode 26 and a surface 24A of the lower electrode 24 inevitably occurs during the removal step of the resist layer 61 using an $O_2$ plasma after the etching for forming the contact hole 31 to expose the upper electrode 26 and the lower electrode 24, both formed of platinum, as shown in FIG. 8.

The conventional semiconductor memory device 500 cannot suppress this catalytic reaction. Therefore, the conventional semiconductor memory device 500 has the problem of creating characteristic degradation of the capacitor element 35 due to the reduction reaction of the capacitor film 25 formed of an insulating metal oxide.

SUMMARY OF THE INVENTION

In one aspect of the invention, a semiconductor memory device includes: a semiconductor substrate including a transistor; a first protective insulating film for covering the semiconductor substrate; at least one data storage capacitor element formed on the first protective insulating film; a second protective insulating film for covering the first protective insulating film and the capacitor element; a hydrogen barrier layer; and an interconnection layer for electrically connecting the transistor and the capacitor element, wherein: the capacitor element includes a lower electrode formed on the first protective insulating film, a capacitor film formed on the lower electrode, and an upper electrode formed on the capacitor film, the capacitor film includes an insulating metal oxide, the second protective insulating film has a first contact hole reaching the upper electrode and a second contact hole reaching the lower electrode, and the hydrogen barrier layer is provided in the first and second contact holes, so as not to expose the upper and the lower electrodes.

In another embodiment of the invention, the hydrogen barrier layer includes a material which is conductive and does not cause a catalytic reaction generating active hydrogen, the hydrogen barrier layer includes at least one material selected from the group consisting of titanium nitride, tantalum nitride, iridium oxide, ruthenium oxide and rhodium oxide, the insulating metal oxide includes at least one material selected from the group consisting of a ferroelectric material having bismuth layered perovskite structure, lead zirconate titanate, strontium barium titanate, or tantalum pentoxide, the upper electrode and the lower electrode each includes at least one material selected from the group consisting of platinum, iridium, ruthenium, and rhodium.

In one aspect of the invention, a method for manufacturing a semiconductor memory device, including the steps of: forming a first protective insulating film for covering a semiconductor substrate including a transistor; forming at least one data storage capacitor element including a lower electrode, a capacitor film formed of an insulating metal oxide, and an upper electrode on the first protective insulating film; forming a second protective insulating film for covering the first protective insulating film and the capacitor element; forming a first contact hole reaching the upper electrode and a second contact hole reaching the lower electrode; forming a hydrogen barrier layer in the first contact hole and in the second contact hole so as not to expose the upper electrode and the lower electrode; forming a resist layer on the second protective insulating film and the hydrogen barrier, and forming a third contact hole reaching the transistor, and forming an interconnection layer for electrically connecting the capacitor element and the transistor.

In one embodiment of the invention, further comprising the step of removing the resist layer by ashing using an oxygen plasma.

According to the present invention, it is possible to suppress the catalytic reaction generating hydrogen on the surface of the upper electrode and of the lower electrode during the resist removal using an oxygen plasma, and preventing the characteristic degradation of the capacitor element due to the reduction reaction of the capacitor film, by lining with the hydrogen barrier layer the inside of the contact holes reaching the upper electrode and the lower electrode.

According to the present invention, it is also possible to suppress the hydrogen catalytic reaction on the surfaces of the upper electrode and the lower electrode as well as secure a good conductivity at the part the upper electrode and the lower electrode connect to the interconnection layer.

After the formation of contact holes reaching the upper electrode and the lower electrode, a catalytic reaction generating hydrogen occurs on the surfaces of the upper electrode and the lower electrode during the removal of the resist layer using an oxygen plasma. According to the present invention, even if the catalytic reaction occurs, it is possible to re-oxidize the capacitor film by heat treatment in an oxygen atmosphere.

After the formation of contact holes reaching the transistor, the resist layer is removed using an oxygen plasma. According to the present invention, however, no catalytic reaction occurs on the surfaces of the upper electrode and the lower electrode during this process because the hydrogen barrier layers are already formed to cover the upper electrode and the lower electrode so as not to expose the electrodes during the resist removal. Thus the capacitor film is not reduced.

Therefore, a capacitor element having superior characteristics is obtained.

Thus, the invention described herein makes possible the advantages of providing a semiconductor memory device with a simple structure which has superb characteristics by suppressing the catalytic reaction generating active hydrogen on a platinum surface and thus suppressing the characteristic degradation of a capacitor element due to the reduction reaction of the capacitor film formed of an insulating metal oxide; and a method for manufacturing such a semiconductor memory device.

These and other advantages of the present invention will become apparent to those skilled in the art upon reading and understanding the following detailed description with reference to the accompanying figures.

DESCRIPTION OF THE PREFERRED EMBODIMENTS

Figure 1:
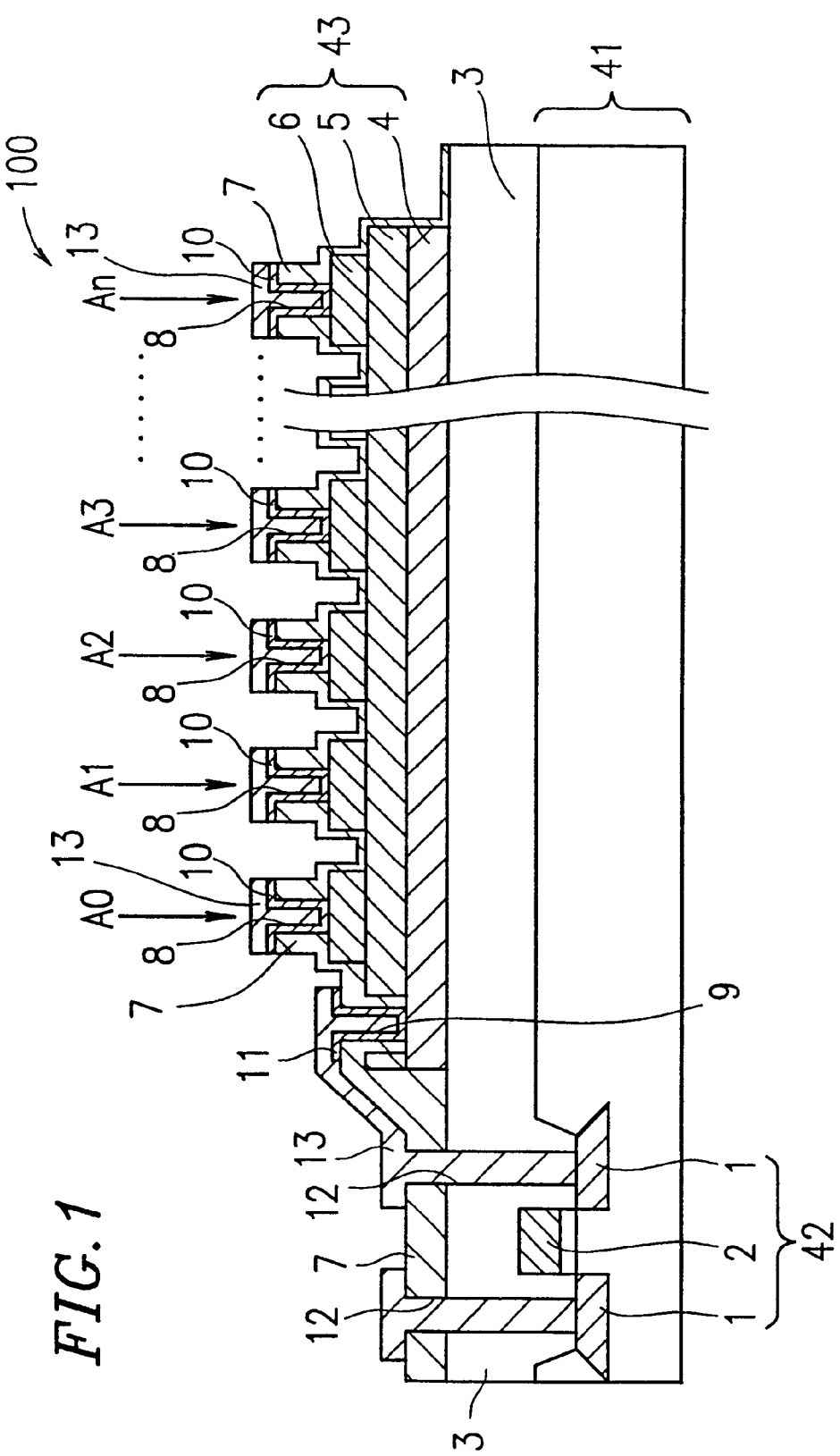
FIG. 1 is a partial cross-sectional view of a semiconductor memory device according to an example of the present invention.
Figure 2A:
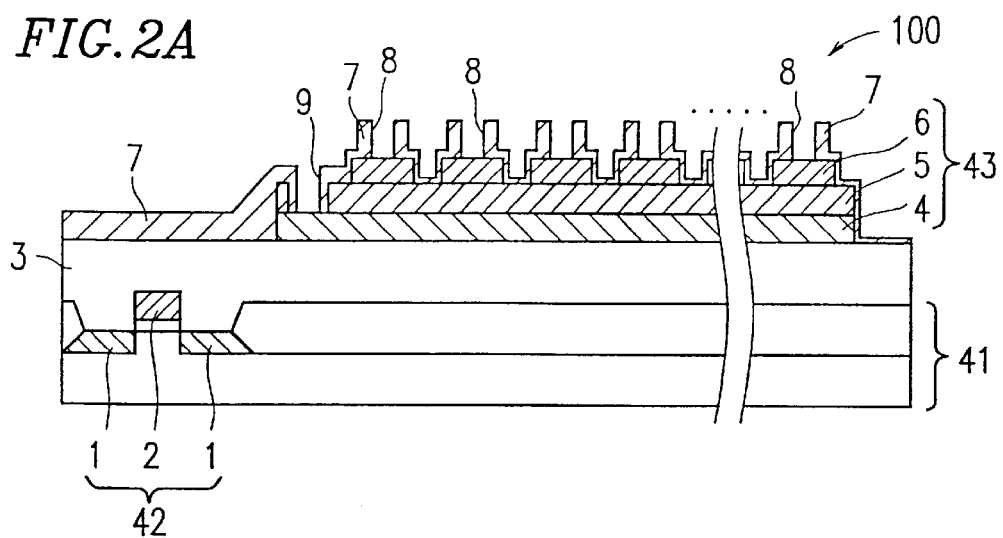
FIGS. 2A through 2C are cross-sectional views showing a manufacturing method of the semiconductor memory device shown in FIG. 1.
Figure 2B:
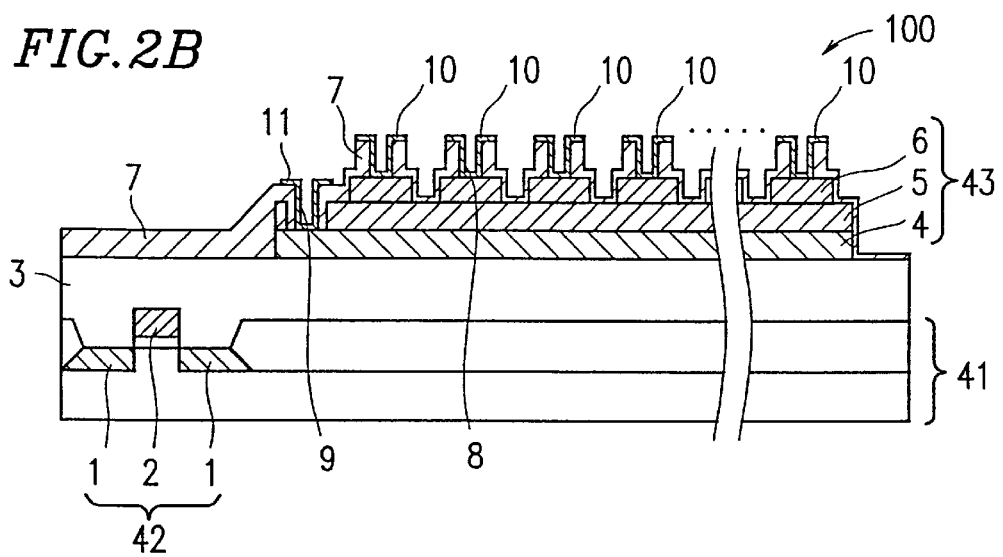
Figure 2C:
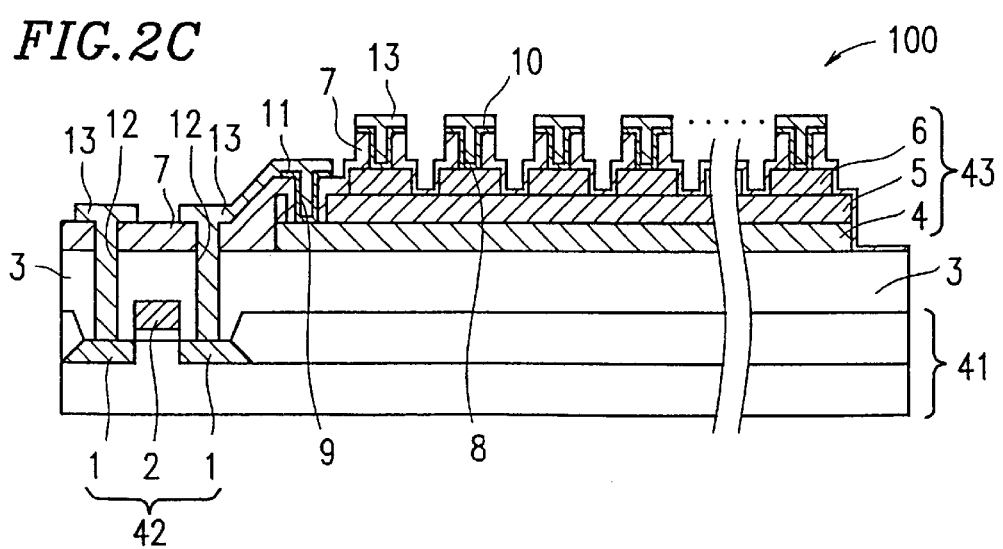
Figure 3:
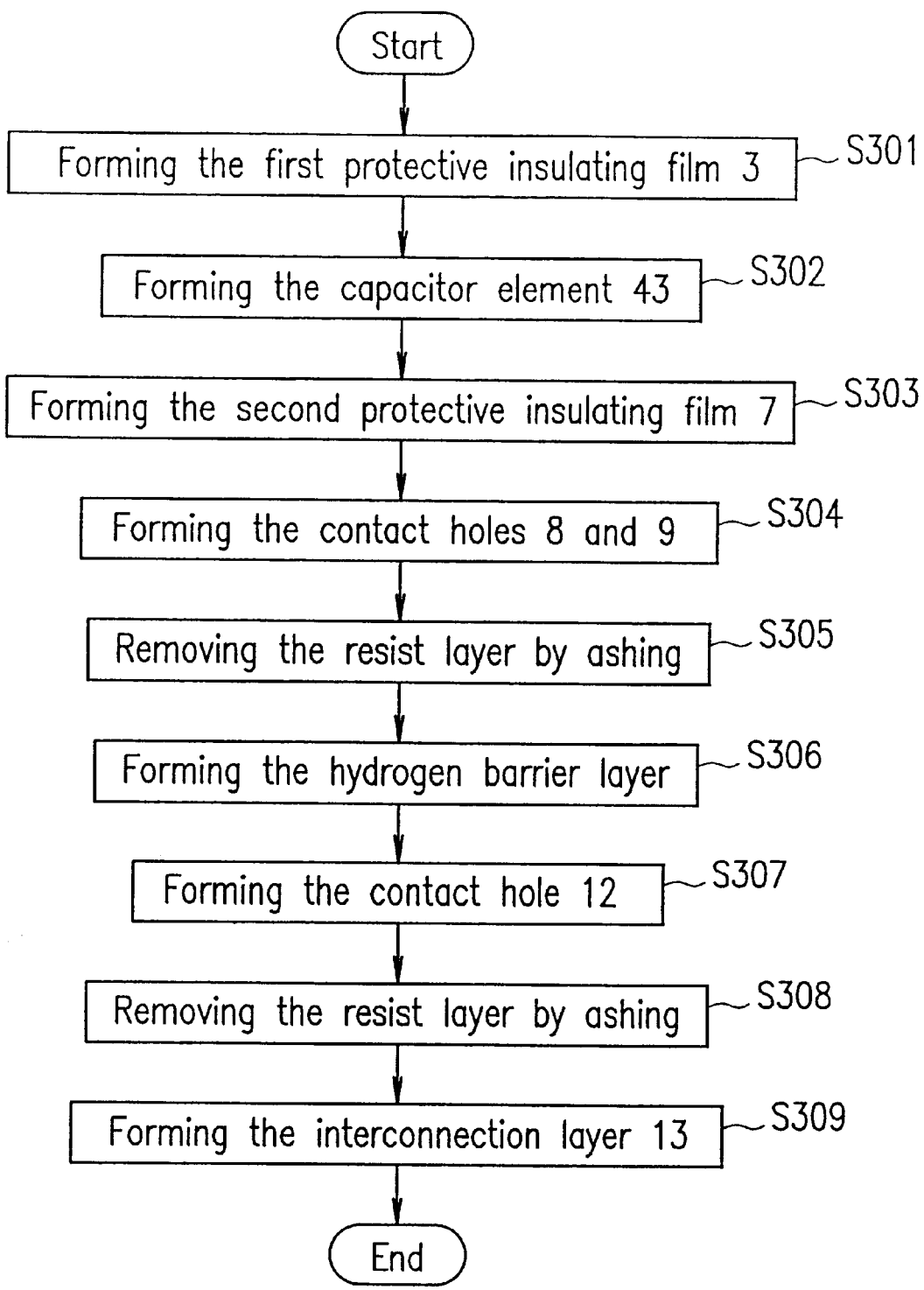
FIG. 3 is a flowchart of the manufacturing method for the semiconductor memory device shown in FIG. 1.

Hereinafter, an example of the present invention will be described referring to FIGS. 1, 2A, 2B, 2C and 3. FIG. 1 is a partial cross-sectional view of a semiconductor memory device 100 according to an example of the present invention. FIGS. 2A through 2C are crosssectional views of the semiconductor memory device 100, illustrating manufacturing steps thereof. FIG. 3 is a flowchart showing a manufacturing method for a semiconductor memory device 100.

Referring to FIG. 1, the semiconductor memory device 100 includes a semiconductor substrate 41 in which a transistor 42 is formed, a first protective insulating film 3 formed to cover the semiconductor substrate 41, a data storage capacitor element 43 formed on the first protective insulating film 3, and a second protective insulating film 7 formed to cover the first protective insulating film 3 and the data storage capacitor element 43.

The data storage capacitor element 43 includes a lower electrode 4 formed on the first protective insulating film 3, a capacitor film 5 formed on the lower electrode 4, and an upper electrode 6 formed on the capacitor film 5. The capacitor film 5 includes an insulating metal oxide.

The second protective insulating film 7 has contact holes 8 formed therethrough reaching the upper electrode 6 and a contact hole 9 formed therethrough toward the lower electrode 4.

The semiconductor memory device 100 further includes hydrogen barrier layers 10 and 11 respectively lining the contact holes 8 and 9. The hydrogen barrier layer 10 is formed so that the upper electrode 6 is not exposed. The hydrogen barrier layer 11 is formed so that the lower electrode 4 is not exposed.

The semiconductor memory device 100 further includes an interconnection layer 13 for electrically connecting the transistor 42 and the data storage capacitor element 43. The transistor 42 includes source and drain regions 1 and a gate region 2.

A method for manufacturing the semiconductor memory device 100 will be explained, referring to FIGS. 2A through 2C and 3.

Referring to FIG. 2A, the first protective insulating film 3 is formed to cover the entire surface of the semiconductor substrate 41 in which the transistor 42 including the source and drain regions 1 and the gate region 2 is formed (S301).

Then, the lower electrode 4 is formed of platinum on the first protective insulating film 3 by a sputtering method, the capacitor film 5 is formed of $SrBi_2(Ta_{1-x}Nb_x)O_9$ by a metal organic decomposition method or a sputtering method, and the upper electrode 6 is formed of platinum by a sputtering method. Then the lower electrode 4, the capacitor film 5, and the upper electrode 6 are processed into the respective predetermined shapes by a dry etching method and thus the data storage capacitor element 43 is formed (S302).

The second protective insulating film 7 is then formed to cover the entire surface of the first insulating film 3 and the data storage capacitor element 43 (S303). Then, a resist layer (not shown) is formed on the entire surface of the second protective insulating film 7, and a mask pattern (not shown) for forming the contact holes 8 and 9 are formed on the resist layer by a lithography method. The second protective insulating film 7 is then processed in accordance with the mask pattern to form the contact holes 8 and the contact hole 9 (S304).

The resist layer is then removed by ashing using an oxygen plasma, and the resultant layers are subsequently heat-treated at 650° C. in an oxygen atmosphere (S305).

Referring to FIG. 2B, a titanium nitride layer to be the hydrogen barrier layers 10 and 11 is then formed on the entire surface of the resultant layers by a sputtering method. A mask pattern (not shown) is formed on the titanium nitride layer by a lithography method so that the hydrogen barrier layers 10 and 11 can be formed to prevent exposure of the upper electrode 6 below the contact holes 8 and the lower electrode 4 below the contact hole 9. Then, the titanium nitride layer is processed in accordance with the mask pattern by a dry etching method to deposit the hydrogen barrier layers 10 lining the contact hole 8 and the hydrogen barrier layer 11 inside the contact hole 9 (S 306).

Referring to FIG. 2C, a resist layer (not shown) is then formed on the entire surface of the second protective insulating film 7 and the hydrogen barrier layers 10 and 11, and a mask pattern (not shown) for forming contact holes 12 reaching the transistor 42 is formed on the resist layer by the lithography method. The contact holes 12 are then formed by processing the first protective insulating film 3 and the second protective insulating film 7 by a dry etching method according to the mask pattern (S307).

Then, the resist layer is removed by ashing using an oxygen plasma (S308). Finally, the interconnection layer 13 is formed by depositing titanium, titanium nitride, aluminum, and titanium nitride in the contact holes 12 and on the second protective insulating film 7 in this order as shown in FIG. 2C, in order to electrically connect the data storage capacitor element 43 and the transistor 42 (S309).

The semiconductor memory device 100 has a plurality of capacitor element portions having respective address numbers A0, A1 ... An, as shown in FIG. 1. As described above, according to this example, the capacitor film 5 can be re-oxidized by heat-treatment in an oxygen atmosphere after the ashing, even if a catalytic reaction generating hydrogen occurs on the surfaces of the upper electrode 6 and the lower electrode 4 when removing the resist layer by ashing using an oxygen plasma after forming the contact holes 8 and 9. In this manner, the semiconductor memory device 100 is produced.

Furthermore, according to this example, since the hydrogen barrier layers 10 and 11 are formed to substantially completely cover the contact holes 8 and 9 so as not to expose the upper electrode 6 and the lower electrode 4 when removing the resist layer by ashing using an oxygen plasma after forming the contact holes 12, no catalytic reaction generating hydrogen occurs on the surfaces of the upper electrode 6 and the lower electrode 4, and therefore the capacitor films are not reduced.

Hereinafter, the result of the characteristic comparisons between the conventional semiconductor memory device 500 and the semiconductor memory device 100 according to the present invention will be described.

Figure 4:
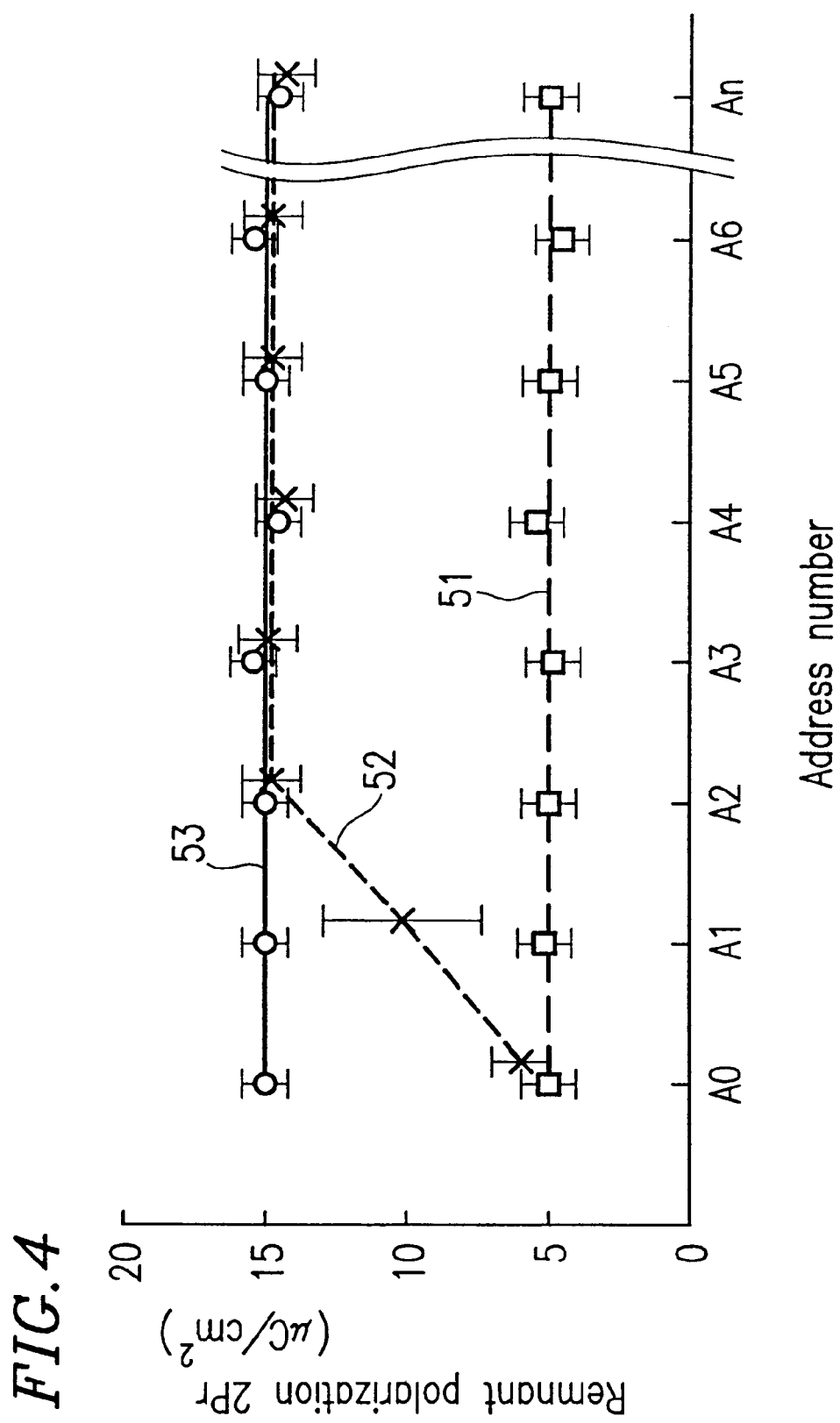
FIG. 4 is a graph comparing the remnant polarization of a capacitor element according to the present invention and of conventional capacitor elements.

FIG. 4 is a graph comparing the remnant polarization of a capacitor element 43 according to the present invention and of a conventional capacitor element.

The horizontal axis of the graph represents each of a plurality of address numbers shown in FIG. 1 and the vertical axis represents the remnant polarization of the data storage capacitor element 43. As shown in FIG. 1, the address numbers A0, A1, A2 ... An are given in sequence from the one nearest to the contact hole 9 above the lower electrode 4. In this specification, the capacitor element portion having the address number A0 will be referred to as the capacitor element portion A0, the capacitor element portion having the address number A1 will be referred to as the capacitor element portion A1, and so on.

In FIG. 4, the line 51 represents the remnant polarization of the semiconductor 500, the line 52 represents the remnant polarization of a semiconductor device provided with a hydrogen barrier layer lining the contact holes 8 reaching the upper electrode 6 only, and the line 53 is the remnant polarization of the semiconductor memory device 100 according to the present invention.

With reference to FIG. 4, it is found that in the case of the semiconductor memory device 500 represented by the line 51, the remnant polarization in all the capacitor element portions A0 through An is about 5 $\mu C/cm^2$, which indicates significant characteristic degradation. This is because the catalytic reaction occurs on the surface of the upper electrode 6 and the lower electrode 4, causing the reduction of the capacitor film 5.

In the case of the semiconductor memory device represented by the line 52, the characteristic degradation in the capacitor element portions A0 and A1 near the lower electrode 4 is indicated by the decrease of the remnant polarization. This is because hydrogen 63 disperses from the contact hole 9 due to the catalytic reaction on the surface of the lower electrode 4 inside the contact hole 9, reaching the data storage capacitor element portions A0 and A1, and then the reduction of the capacitor film 5 occurs.

In the semiconductor memory device 100 according to this example of the present invention, where the hydrogen layers 10 and 11 formed with titanium nitride are provided on the surface of the upper electrode 6 inside the contact holes 8 and the lower electrode 4 inside the contact hole 9, as represented by the line 53, no characteristic degradation indicated by the decrease of the remnant polarization occurs in any of the capacitor element portions. This is because the catalytic reaction generating hydrogen is substantially perfectly prevented on the upper electrode 6 and the lower electrode 4, and no reduction of the capacitor element 5 occurs.

Figure 5:
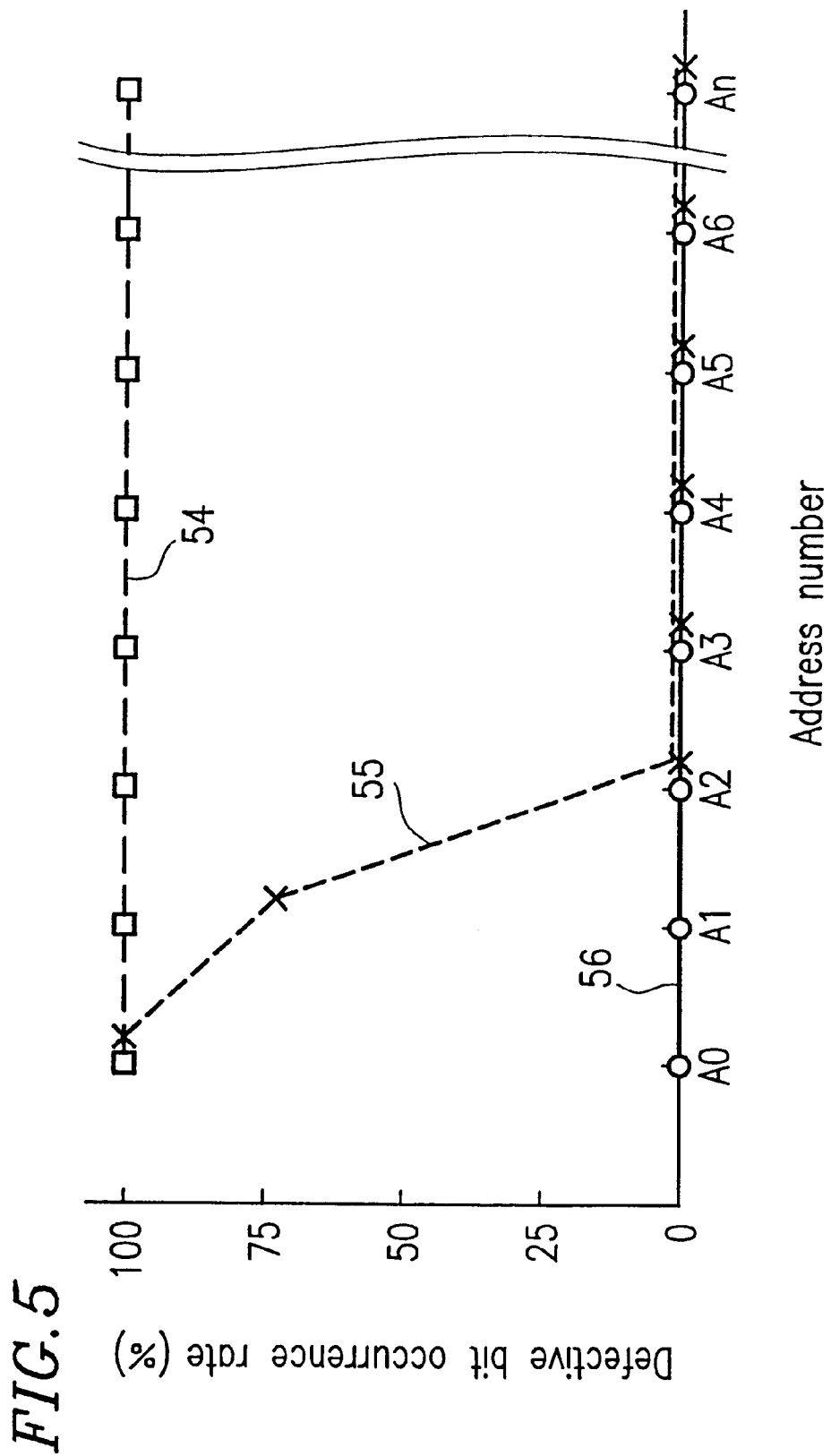
FIG. 5 is a graph comparing the defective bit occurrence rate of a semiconductor device according to the present invention and of a conventional semiconductor device.
Figure 6:
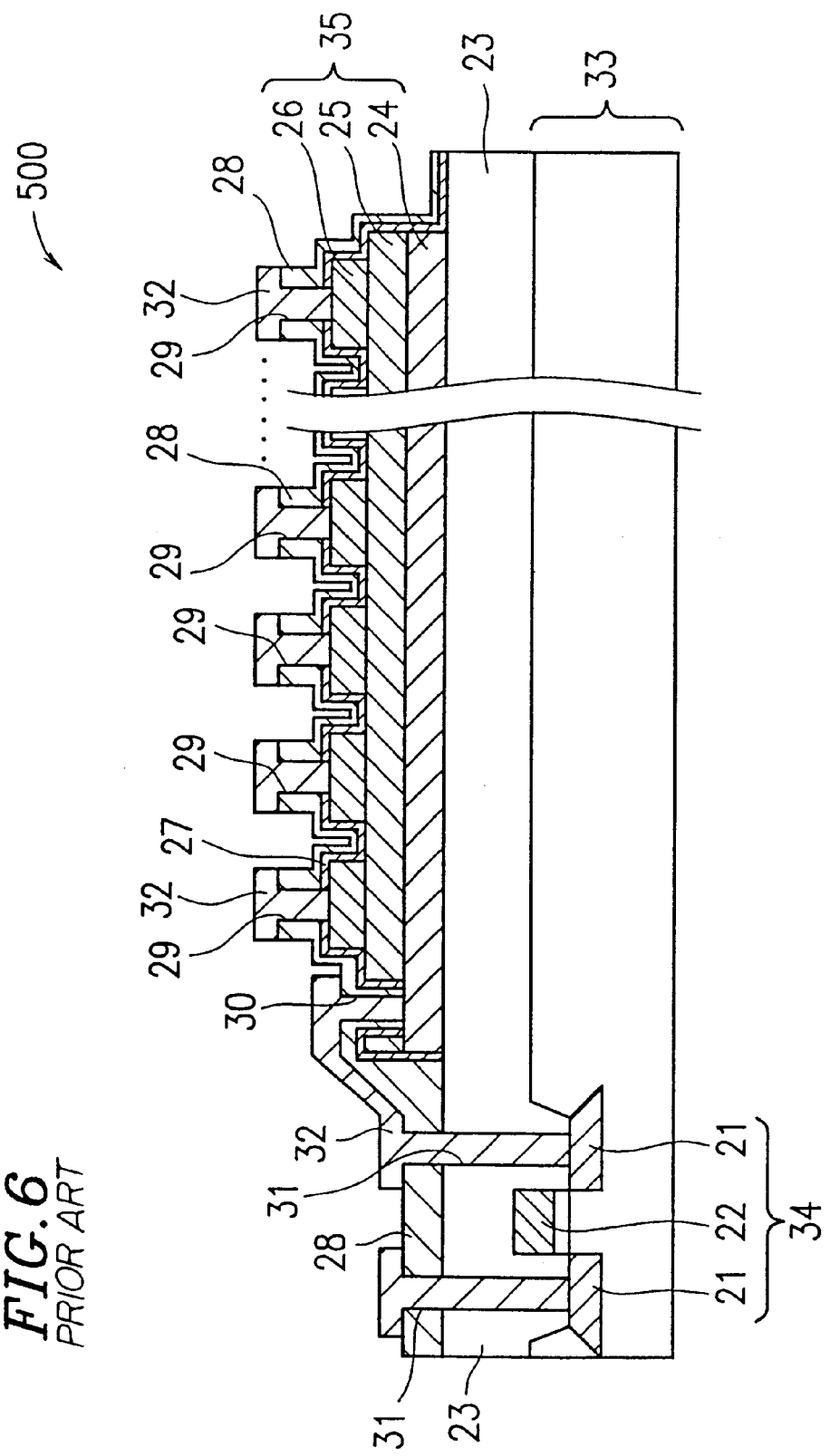
FIG. 6 is a partial cross-sectional view of a conventional semiconductor memory device.
Figure 7A:
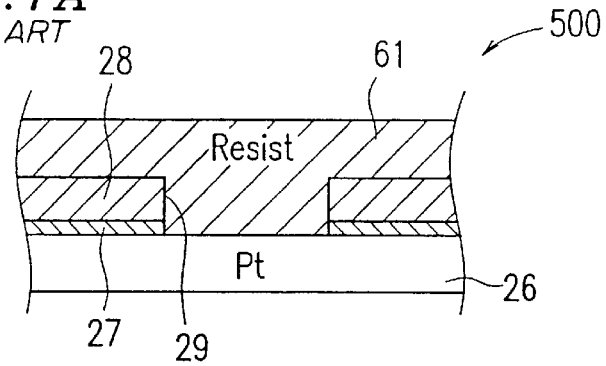
FIGS. 7A through 7D are cross-sectional views diagram showing the mechanism of defect generation during a manufacturing method for the conventional semiconductor memory device shown in FIG. 6.
Figure 7B:
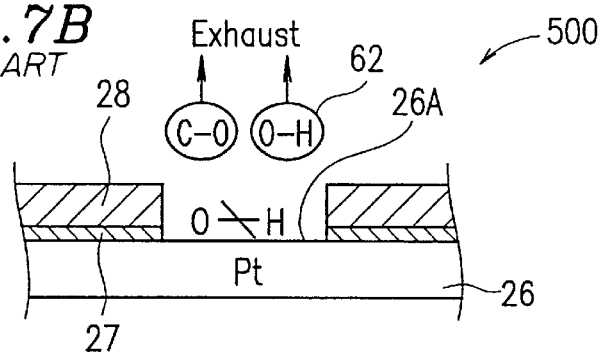
Figure 7C:
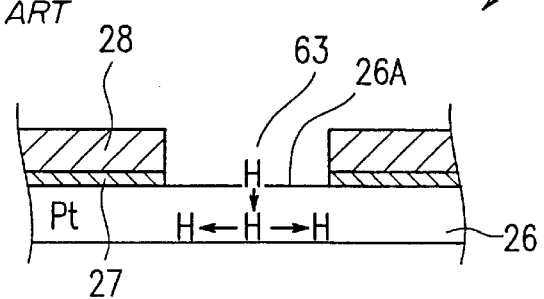
Figure 7D:
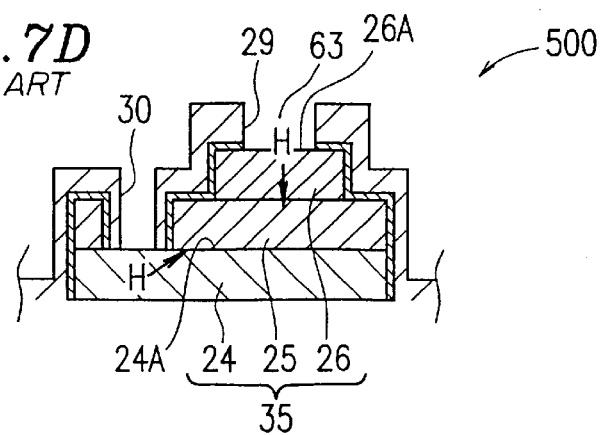
Figure 8:
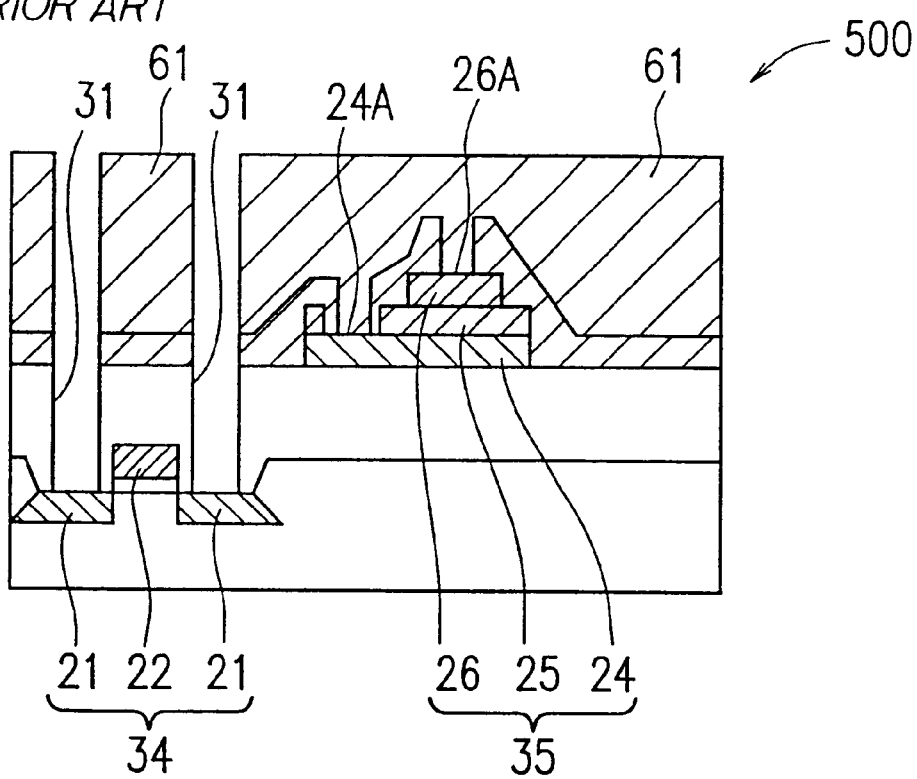
FIG. 8 is a cross-sectional view of the conventional semiconductor memory device shown in FIG. 6 during a manufacturing step in which a defect is generated.

FIG. 5 is a graph comparing the defective bit occurrence rate of a semiconductor device 100 according to the present invention and of a conventional semiconductor device.

The horizontal axis of the graph represents each of a plurality of address numbers shown in FIG. 1 and the vertical axis represents the defective bit occurrence rate. The line 54 represents the defective bit occurrence rate of the semiconductor 500, the line 55 represents the defective bit occurrence rate of a semiconductor device provided with a hydrogen barrier layer only in the contact holes 8 on the upper electrode 6, and the line 56 is the defective bit occurrence rate of the semiconductor memory device 100 according to the present invention.

In the case of the semiconductor memory device 500 represented by the line 54, all the capacitor element portions A0 through An show a 100% defective bit occurrence rate due to the significant characteristic degradation indicated by the decrease of the remnant polarization. In the case of the semiconductor memory device represented by the line 55, defects occur in the capacitor element portions A0 and A1 near the contact hole 9 reaching the lower electrode 4. In the case of the semiconductor memory device according to the present invention represented by the line 56, a defect rate of 0% is achieved in all the capacitor element portions A0 through An.

Therefore, it is understood that according to the present example, the characteristics of the semiconductor memory device are greatly improved. FIG. 5 shows the performance of the capacitor elements shown in FIG. 4.

As shown in the experiment results in FIGS. 4 and 5, according to the present example, a semiconductor memory device including a capacitor element having superb characteristics is obtained.

Although in the manufacturing steps of the semiconductor memory device 100 according to this example, the heat treatment after the ashing is performed at 650° C. in an oxygen atmosphere, the present invention is not limited to this condition. As long as the temperature is within the range of 600 to 850° C. oxidization of the capacitor film is possible, so as to obtain a similar effect.

Although in the present example, titanium nitride is employed for the hydrogen barrier layers 10 and 11, the present invention is not limited to this material. A similar effect is achieved as long as a material not causing a catalytic reaction generating hydrogen and having good conductivity, such as either tantalum nitride, iridium oxide, rutheniumn oxide, or rhodium oxide is used, or at least two of these materials are deposited sequentially.

Although in the present example, $SrBi_2(Ta_{1-x}Nb_x)O_9$ is employed for the capacitor film 5, the present invention is not limited to this material. A similar effect is achieved by using other materials such as ferroelectric materials having bithmus layered perovskite structure, lead zirconate titanate, strontium barium titanate, or tantalum pentoxide.

According to this example, platinum is employed as the upper electrode 6 and the lower electrode 4, the present invention is not limited to this material. A similar effect is obtained by using an electrode including a deposition layer having either iridium, ruthenium, or rhodium, or a combination thereof.

As described above, according to the present invention, the catalytic reaction generating hydrogen on the surface of the upper electrode and the lower electrode occurring during removal of the resist layer using an oxygen plasma is suppressed, which alleviates the characteristic degradation due to the reduction reaction of the capacitor film. Therefore, it is possible to obtain a semiconductor memory device having a better characteristics by an simpler method.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor memory device, comprising:
   a semiconductor substrate including a transistor;
   a first protective insulating film for covering the semiconductor substrate;
   at least one data storage capacitor element formed on the first protective insulating film;
   a second protective insulating film for covering the first protective insulating film and the capacitor element;
   a hydrogen barrier layer; and
   an interconnection layer for electrically connecting the transistor and the capacitor element,
   wherein:
      the capacitor element includes a lower electrode formed on the first protective insulating film, a capacitor film formed on the lower electrode, and an upper electrode formed on the capacitor film,
      the capacitor film includes an insulating metal oxide,
      the second protective insulating film has a first contact hole reaching the upper electrode, a second contact hole reaching the lower electrode and a third contact hole reaching the transistor via the first protective insulating film, and
      the hydrogen barrier layer is provided in the first and second contact holes, so as not to expose the upper and the lower electrodes, whereas the hydrogen barrier layer is not provided in the third contact hole, such that the transistor is exposed.

2. A semiconductor memory device according to claim 1, wherein the hydrogen barrier layer includes a material which is conductive and does not cause a catalytic reaction generating active hydrogen.

3. A semiconductor memory device according to claim 1, wherein the hydrogen barrier layer includes at least one material selected from the group consisting of titanium nitride, tantalum nitride, iridium oxide, ruthenium oxide and rhodium oxide.

4. A semiconductor memory device according to claim 1, wherein the insulating metal oxide includes at least one material selected from the group consisting of a ferroelectric material having bismuth layered perovskite structure, lead zirconate titanate, strontium barium titanate, or tantalum pentoxide.

5. A semiconductor memory device according to claim 1, wherein the upper electrode and the lower electrode each includes at least one material selected from the group consisting of platinum, iridium, ruthenium, and rhodium.

* * * * *